United States Patent
Pawlak

(10) Patent No.: US 7,615,430 B2
(45) Date of Patent: Nov. 10, 2009

(54) FIELD EFFECT TRANSISTOR AND METHOD OF MANUFACTURING A FIELD EFFECT TRANSISTOR

(75) Inventor: Bartlomiej Jan Pawlak, Leuven (BE)

(73) Assignee: NXP B.V., Eindhoven (NL)

( * ) Notice: Subject to any disclaimer, the term of this patent is extended or adjusted under 35 U.S.C. 154(b) by 153 days.

(21) Appl. No.: 10/598,755

(22) PCT Filed: Mar. 8, 2005

(86) PCT No.: PCT/IB2005/050841

§ 371 (c)(1),
(2), (4) Date: Sep. 11, 2006

(87) PCT Pub. No.: WO2005/091350

PCT Pub. Date: Sep. 29, 2005

(65) Prior Publication Data

US 2007/0184620 A1    Aug. 9, 2007

(30) Foreign Application Priority Data

Mar. 16, 2004   (EP)   ................... 04101071

(51) Int. Cl.
*H01L 21/8238*    (2006.01)
(52) U.S. Cl. ..................................... 438/199

(58) Field of Classification Search ................. 438/199, 438/289, 290–291, 301, 305, 306, 528
See application file for complete search history.

(56) References Cited

U.S. PATENT DOCUMENTS

| | | | |
|---|---|---|---|
| 5,773,348 A * | 6/1998 | Wu | 438/305 |
| 6,180,476 B1 | 1/2001 | Yu | |
| 6,245,618 B1 * | 6/2001 | An et al. | 438/289 |
| 6,268,640 B1 | 7/2001 | Park et al. | |
| 6,521,502 B1 * | 2/2003 | Yu | 438/305 |
| 2001/0014495 A1 | 8/2001 | Yu | |
| 2002/0102801 A1 * | 8/2002 | Lai et al. | 438/305 |
| 2003/0207527 A1 * | 11/2003 | Mehrad et al. | 438/207 |

* cited by examiner

*Primary Examiner*—Ha Tran T Nguyen
*Assistant Examiner*—Shaun Campbell

(57) ABSTRACT

The invention relates to a method of manufacturing a field effect transistor, in which a semiconductor body of silicon is provided at a surface thereof with a source region and a drain region of a first conductivity type, which regions are both provided with extensions, and with a gate region situated above the channel region. A pn-junction is formed between the extensions and a neighboring part of the channel region using an amorphizing implantation followed by two implantations of dopants of opposite conductivity type, before the gate region is formed and at an angle with the surface of the semiconductor body which is substantially equal to 90 degrees. A steep and abrupt vertical part of the pn-junction is thus formed with a very low leakage current due to the absence of implantations defects. In some embodiments, a low temperature anneal is used to regrow crystalline silicon.

20 Claims, 3 Drawing Sheets

FIELD EFFECT TRANSISTOR AND METHOD OF MANUFACTURING A FIELD EFFECT TRANSISTOR

The invention relates to a method of manufacturing a semiconductor device comprising a field effect transistor, in which method a semiconductor body of silicon is provided at a surface thereof with a source region and a drain region of a first conductivity type, which regions are both provided with extensions, and with a channel region of a second conductivity type, opposite to the first conductivity type, between the source region and the drain region, and with a gate region separated from the surface of the semiconductor body by a gate dielectric and situated above the channel region, and wherein a pn-junction between the extensions and a neighboring part of the channel region is formed by two implantations of dopants of opposite conductivity type, and wherein before both of said two implantations of opposite conductivity type dopants are performed an amorphizing implantation is performed where the pn-junction is to be formed. Such a method is very suitable for making MOSFET (=Metal Oxide Semiconductor Field Effect Transistor) devices. The amorphizing implantation helps to prevent channeling of subsequently implanted dopants and thus contributes to obtaining a steeper pn-junction.

Figure 1:
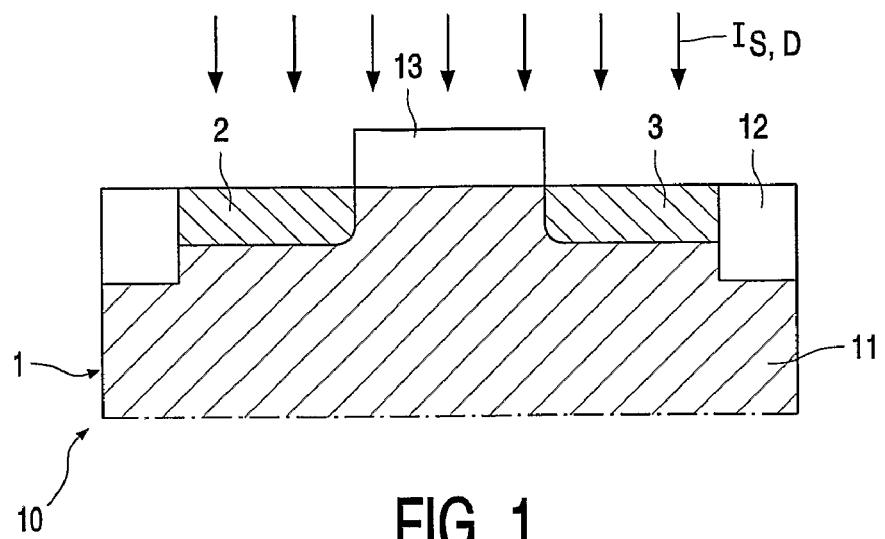
Figure 2:
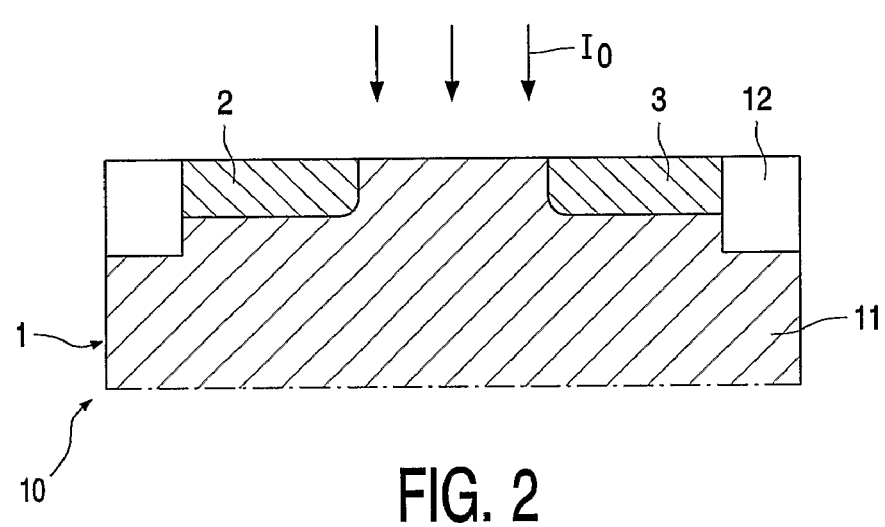
Figure 3:
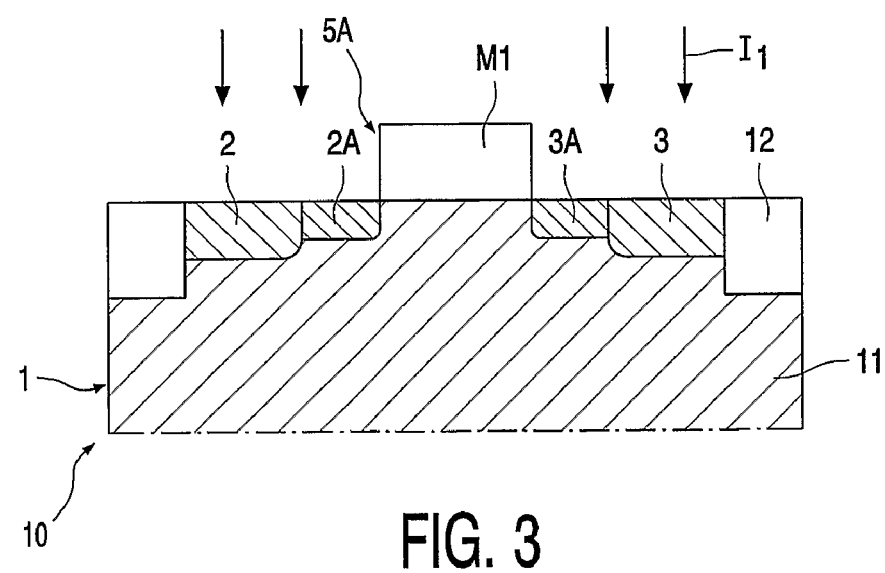
Figure 4:
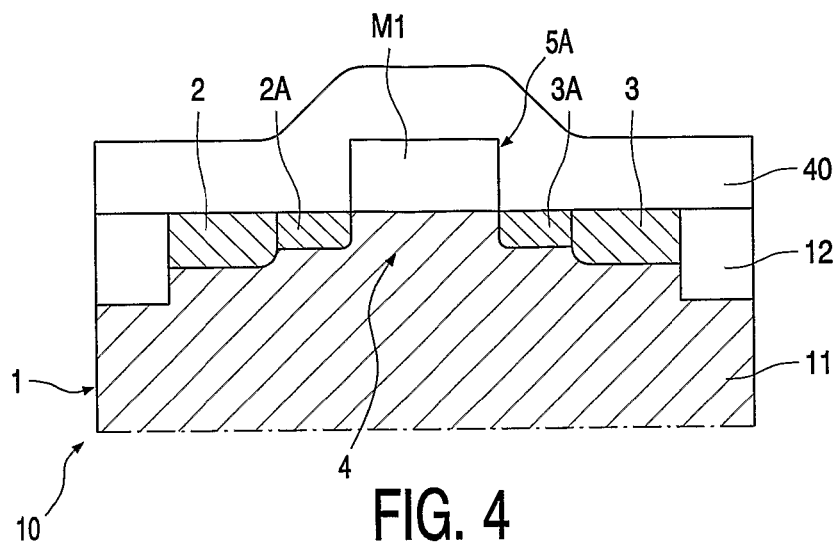
Figure 5:
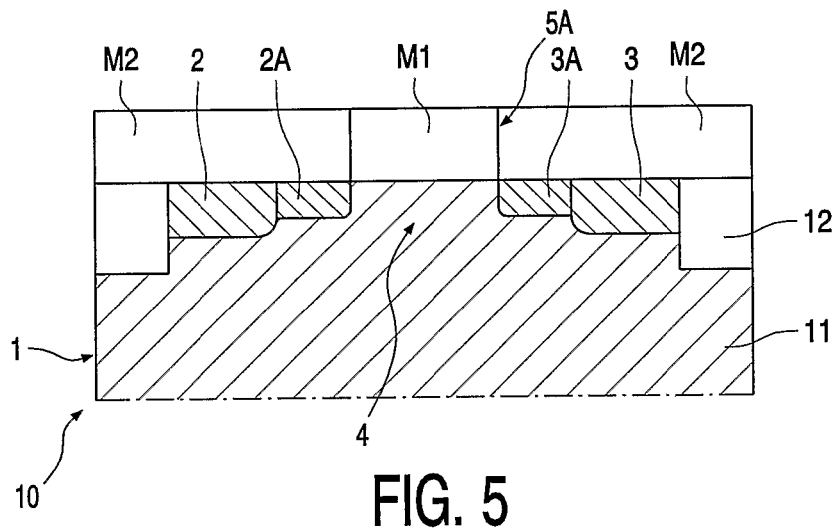
Figure 6:
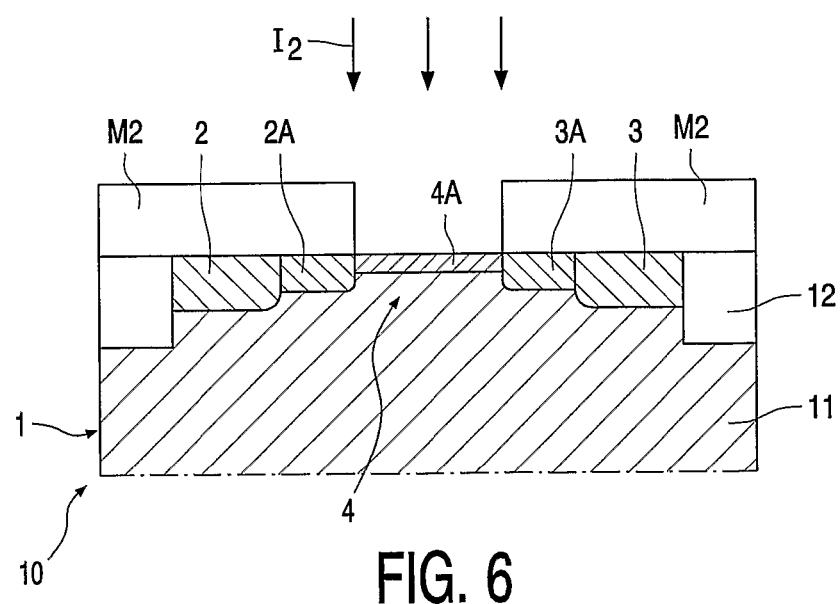
Figure 7:
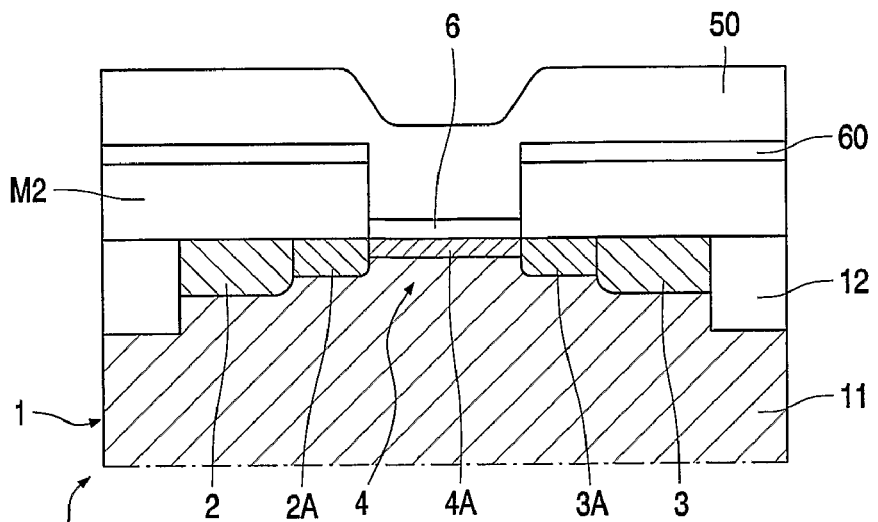
Figure 8:
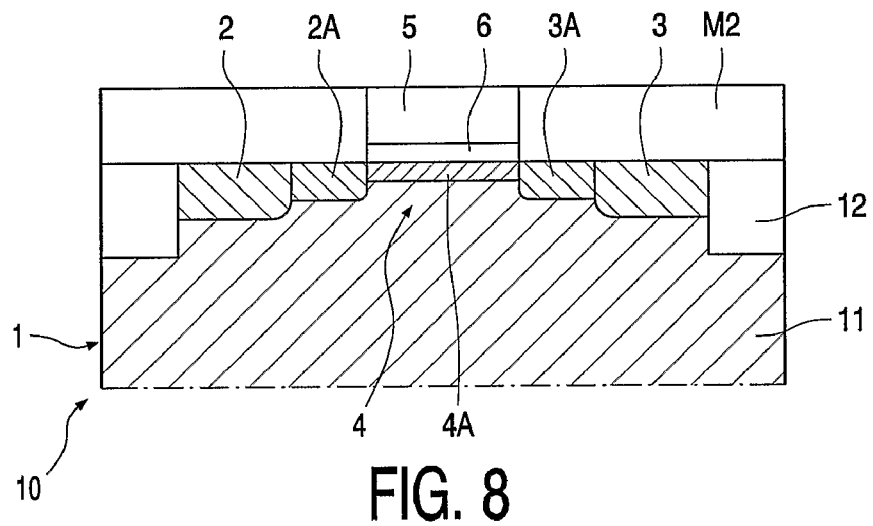
Figure 9:
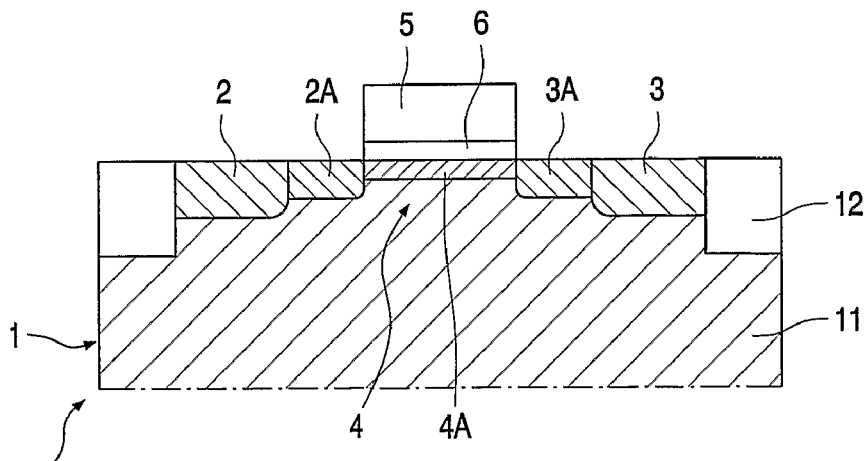

A method as mentioned in the opening paragraph is known from U.S. Pat. No. 6,268,640 B1 that was issued on Jul. 31, 2001. Therein (see FIG. 6 and columns 3 to 5) a method is described in which shallow extensions of source and drain are formed by implanting suitable dopants into the semiconductor body, and in which in addition a so-called pocket dopant layer, of an opposite conductivity type, is formed around the extensions by an implantation of opposite conductivity type dopants. Before both above-mentioned implantations, an amorphizing implantation of e.g. Ge or Si is carried out in the region around the pn-junction formed between the source- and drain extensions and a neighboring part of the channel region, in this case the pocket region. As mentioned before, such an implant helps avoiding channeling of the subsequently implanted opposite conductivity type dopants and thus contributes to obtaining a steeper pn-junction. In order to form the pn-junction below the gate, the above US patent teaches to carry out the amorphizing implantation as well as the two opposite conductivity implantations at a tilt angle, i.e. at a non-zero angle with the normal of the surface of the semiconductor body. The above mentioned implantations are subsequently annealed at a temperature in the range of 900 to 1050 degrees Celsius.

A drawback of such a method is that, on the one hand, the shallowness and steepness of the pn-junction to be formed as well as the electrical quality thereof are still not sufficient for future CMOS devices, in particular the diode leakage current of the pn-junction is too high.

It is therefore an object of the present invention to avoid the above drawbacks and to provide a method which does provide satisfactory results for very small devices and by which a very shallow and steep pn-junction is obtained with an excellent electrical quality and thus with a low (diode) leakage current.

To achieve this, a method of the type described in the opening paragraph is characterized in that the amorphizing implantation and said two implantations of dopants of opposite conductivity type are carried out before the gate region is formed and at an angle with the surface of the semiconductor body which is substantially equal to 90 degrees. The present invention is firstly based on the recognition that the increased diode leakage is caused by defects in the material of the semiconductor body which are introduced by the amorphizing implantation and which are present at the end of the projected range of said implantation. If such an implantation is carried out at a tilt angle, such defects are present also in the neighborhood of the vertical part (i.e. the part perpendicular to the surface of the semiconductor body) of the pn-junction to be formed. Said part is most critical with respect to its contribution to the leakage current associated with the diode formed by the pn-junction. Furthermore, the invention is based on the recognition that if said implantation is performed before the gate is formed, it may easily be performed in a direction perpendicular to the surface of the semiconductor body. Furthermore, by also carrying out the two opposite conductivity type implantations before the gate is formed and at an angle substantially perpendicular to the surface of the semiconductor body, the steepness of said vertical part of the pn-junction to be formed is improved. Thus, in a device obtained by means of a method according to the present invention, said vertical part of the pn-junction is of very high electrical quality and moreover very steep. It is to be noted that the neighboring part of the channel region does not necessarily have to be a so-called pocket region. The only requirement to be met is that said region, just like a pocket region and the channel region itself for that matter, is of the opposite conductivity type compared to the source and drain and their extensions.

In a first embodiment of a method according to the invention, a first implantation of said two opposite conductivity type implantations is carried out using a first mask covering a first region of the semiconductor body and the second implantation is carried out after removal of the first mask, using a second mask of which the edge coincides with the edge of the first mask. Although one of the two implantations might be carried out in a larger area and the other one with a mask of which the edge is positioned above said area, this embodiment in which the two implantations border each other provides more freedom in choosing the doping concentrations as there is no need for overcompensation. In particular the doping concentrations may be about equally large. This also contributes to the steepness of said vertical part of the pn-junction. Preferably, the first mask and the second mask are formed in a self-aligned manner. In this way the vertical part of the pn-junction is very steep, and it is avoided that a region is present at the location of the pn-junction which is not doped by either of the two opposite conductivity type implantations.

In a preferred embodiment of a method according to the invention, the first mask is formed by a dummy gate region of a first dielectric material, and the first implantation is used to form the extensions of the source and drain regions. Such a method allows for a good positioning of the source and drain extensions with respect to the gate provided the gate region is formed at the same location as the dummy gate region. The latter is possible as will be shown by a further embodiment.

Preferably, after the first implantation a uniform masking layer of a second dielectric material different from the first dielectric material is deposited on the semiconductor body and is subsequently removed by chemical mechanical polishing from the top of the dummy gate region which is then removed by selective etching, the remainder of the masking layer forming the second mask for the second implantation which is used to dope the neighboring part of the channel region. In this way, the implantation of the two opposite conductivity type implantations used to form the (vertical part of the) pn-junction, by implanting a neighboring part of the channel region, is formed in a self-aligned manner with respect to the source- and drain extensions.

A favorable modification is characterized in that, after the second implantation, a uniform gate region layer is formed on top of the semiconductor body and is subsequently removed by chemical mechanical polishing from the top of the second mask which is then removed by selective etching. In this way the gate region becomes self-aligned with both the position of the source- and drain extensions and the neighboring part of the implantation. Of course, the gate region should contain at its bottom a dielectric region. The latter may be included in the gate region layer if the dielectric region is formed by deposition. According to another possibility, in which the dielectric region is formed e.g. by oxidation of the silicon surface, such an oxidation may be performed before the gate region layer is deposited. It may be formed so as to be self-aligned, just before of after the second implantation, using the window formed by removal of the dummy gate. In these cases, the gate region layer does not necessarily include a dielectric part but may merely comprise e.g. a polysilicon layer or a metal layer if a metal gate is desired.

In another preferred embodiment of a method according to the invention, the first and second implantations ($I_1$, $I_2$) are annealed at a temperature between 500 and 700 degrees Celsius. In this way, both the horizontal and the vertical part of the pn-junction are formed by solid phase epitaxial regrowth. This greatly contributes to the shallowness and steepness of the pn-junction formed, which in turn is essential for future C-MOS technology.

Preferably, the (deeper) source- and drain regions themselves are formed before the formation of the source- and drain extensions and the pn-junction thereof with the part of the channel region neighboring the source- and drain extensions. In this way, the source- and drain regions may be formed at a higher temperature, e.g. by implantation followed by an anneal at a temperature well above 700 degrees Celsius.

For the amorphizing implantation not only ions like Ge or Si ions may be used but also ions of an inert gas like Ar or Xe can be used advantageously. Also dopants that are "self-amorphizing" may be considered, e.g. As, P and Sb. The self-amorphizing effect of an implantation of these impurities occurs above a certain implantation energy and also depends on the implantation flux. Particularly in the case of As ions it has been found to be advantageous if part of the amorphizing implantation is taken over by the As implantation itself. In a modification of the above embodiments in accordance with this principle, the amorphizing implantation by means of Ge, Si or Ar, Xe is carried out after placement of the first mask, and subsequently the first doping implantation ($I_1$) is carried out, which in this case is a p-type implantation. Afterwards the first mask is removed and the second mask is placed. Then the second doping ($I_2$), in this case an As implantation, is performed which is self-amorphizing.

The invention further comprises a semiconductor device with a field effect transistor which is obtained with a method according to the invention. In such a device the pocket region may have a very abrupt and narrow doping profile.

These and other aspects of the invention will be apparent from and elucidated with reference to the embodiments described hereinafter, to be read in conjunction with the drawing, in which:

FIGS. 1 through 9 are sectional views of a semiconductor device with a field effect transistor at various stages in the manufacture of the device by means of a method in accordance with the invention.

The Figures are diagrammatic and not drawn to scale, the dimensions in the thickness direction being particularly exaggerated for greater clarity. Corresponding parts are generally given the same reference numerals and the same hatching in the various Figures.

FIGS. 1 through 9 are sectional views of a semiconductor device with a field effect transistor at various stages in the manufacture of the device by means of a method in accordance with the invention. The method for forming a device 10 starts (see FIG. 1) in this example with a substrate 11 which in this case, but not necessarily, comprises silicon, and thus also forms part of the semiconductor body 1 of silicon, and which in this example is of the p-conductivity type. It is to be noted here that the substrate 11 can also be of the opposite conductivity type. Moreover, the region 11 may also be e.g. an n-well (or p-well) within a silicon substrate of the opposite conductivity type, e.g. p-type and n-type respectively. Furthermore, the substrate/region 11 comprises the channel region 4 of the transistor to be formed. The device 10 to be formed, which is in this case an NMOST, contains in practice, near its borders, isolation regions 12 such as a so-called trench or LOCOS (=Local Oxidation of Silicon) isolation, which are formed in a conventional manner. In practice the device 10 will contain many transistors, both of the NMOS and PMOS type, in a CMOS device 10.

At the surface of the semiconductor body 1 a mask 13 is formed by photolithography, if desired after deposition of a dielectric material which then comprises a photoresist or a dielectric. The mask 13 is used to form the source- and drain regions 2,3 of the transistor to be formed, in this case by means of an ion implantation $I_{S,D}$ of n-type dopants like As ions followed by a high temperature anneal at a temperature above 900 degrees Celsius.

After removal of the mask 13 (see FIG. 2) an amorphizing implantation $I_o$ is performed, in this example of Si ions. The resulting amorphous silicon region near the surface of the semiconductor body 1 is not indicated separately in the drawing.

Next (see FIG. 3), a dummy gate region 5A is formed by deposition of a layer of a first dielectric material, like silicon dioxide, which is patterned by means of photolithography and etching into a first mask M1 which comprises the dummy gate region 5A. The mask M1 is used for a first ion implantation $I_1$ of, in this case, n-type impurities, like As ions. In this way, shallow source- and drain extensions 2A,3A are formed.

Subsequently (see FIG. 4), a layer 40 comprising a second, different, dielectric material, in this case silicon nitride is deposited uniformly over the surface of the semiconductor body 1. Next (see FIG. 5) said layer 40 is partly removed by chemical-mechanical polishing such that the mask M1 is freed of said layer 40. The remaining part of the masking layer 40 forms a second mask M2. Next (see FIG. 6) the first mask M1 is removed by selective etching with respect to the second mask M2. Then, a second ion implantation $I_2$ is performed with ions of impurities that form the second (opposite) conductivity type, e.g. B ions. In this way a region 4A of the channel region 4 is formed which borders the source- and drain extensions 2A,3A.

Thanks to the method according to invention, the vertical part of the pn-junction formed—after an annealing step to be discussed hereinafter—between the region 4A of the channel region 4 and the source- and drain extensions 2A,3A is, on the one hand, very steep and abrupt and, on the other hand, has excellent diode properties like a low leakage current, the latter being due to the fact that there are no or at least very few defects in the surface regions of the semiconductor body 1 that border said vertical part of said pn-junction.

Next (see FIG. 7), a gate region forming layer 50,60 is deposited on top of the semiconductor body, in this example by means of CVD (=Chemical Vapor) deposition. In this example the said gate region forming layer 50,60 comprises a thin dielectric region layer 60 and a thicker polysilicon layer 60.

Subsequently (see FIG. 8), the semiconductor body 1 is again treated by chemical-mechanical polishing in order to locally remove said gate region layer 50,60 above the second mask M2. The remaining parts of said layer 50,60 form the gate dielectric 6 and the, in this case polysilicon, gate 5 of the transistor to be formed.

Next (see FIG. 9), the second mask M2 is removed by (selective) etching. The surface of the semiconductor body 1 outside the gate region 5,6 will be covered and protected by a dielectric layer, e.g. of silicon dioxide, which is not indicated in the drawing and which may be provided at a stage of the manufacturing process where this surface may be approached. A (low temperature) thermal oxidation or a deposition may be used for that purpose.

Next, the amorphous silicon resulting from the opposite conductivity type implantations ($I_1$, $I_2$), but essentially from the amorphizing implantation ($I_0$), is recovered in an annealing process at a temperature between 500 and 700 degrees Celsius, preferably between 550 and 650 degrees Celsius. I.

Finally, the manufacturing of the n-MOSFET is further completed by deposition of a pre-metal dielectric, e.g. silicon dioxide, followed by patterning thereof, deposition of a contact metal layer, e.g. of aluminum, again followed by patterning, resulting in the formation of contact regions. These steps are not shown in the drawing. A (self-aligned) silicide process may further be used to contact the source- and drain regions 2,3 and the gate region 5.

It will be obvious that the invention is not limited to the examples described herein, and that within the scope of the invention many variations and modifications are possible to those skilled in the art.

The invention claimed is:

1. Method of manufacturing a semiconductor device comprising a field effect transistor, in which method a semiconductor body of silicon is provided at a surface thereof with a source region and a drain region of a first conductivity type, which regions are both provided with extensions, and with a channel region of a second conductivity type, opposite to the first conductivity type, between the source region and the drain region, and with a gate region separated from the surface of the semiconductor body by a gate dielectric and situated above the channel region, and wherein a pn-junction between the extensions and a neighboring part of the channel region is formed by two implantations of dopants of opposite conductivity type, and wherein before both of said two implantations of dopants of opposite conductivity type are performed an amorphizing implantation is performed where the pn-junction is to be formed, characterized in that the amorphizing implantation and said two implantations of dopants of opposite conductivity type are performed before the gate region is formed and at an angle with the surface of the semiconductor body which is substantially equal to 90 degrees.

2. Method according to claim 1, characterized in that a first implantation of said two opposite conductivity type implantations is carried out using a first mask covering a first region of the semiconductor body and the second implantation of the two implantations is carried out after removal of the first mask, using a second mask of which the edge coincides with the edge of the first mask.

3. Method according to claim 2, characterized in that the first mask and the second mask are formed in a self-aligned manner.

4. Method according to claim 2, characterized in that the first mask is formed by a dummy gate region of a first dielectric material, and the first implantation is used to form the extensions of the source and drain regions.

5. Method according to claim 4, characterized in that after the first implantation a uniform masking layer of a second dielectric material different from the first dielectric material is deposited on the semiconductor body and is subsequently removed by chemical mechanical polishing from the top of the dummy gate region which is then removed by selective etching, the remainder of the masking layer forming the second mask for the second implantation which is used to dope the neighboring part of the channel region.

6. Method according to claim 5, characterized in that, after the second implantation, a uniform gate region layer is formed on top of the semiconductor body and is subsequently removed by chemical mechanical polishing from the top of the second mask which is then removed by selective etching.

7. Method as claimed in claim 1, characterized in that the two implantations are annealed at a temperature between 500 and 700 degrees Celsius.

8. Method as claimed in claim 1, characterized in that the source and drain regions are formed before the source and drain extensions.

9. Method as claimed in claim 1, characterized in that for the amorphizing implantation ions are chosen from a group comprising Ge, Si, Ar or Xe.

10. Method as claimed in claim 1, characterized in that a part of the function of the amorphizing implantation is provided by one of the two opposite conductivity type implantations.

11. A semiconductor device comprising a field effect transistor obtained with a method as claimed in claim 1.

12. A method of manufacturing a semiconductor device comprising:
    providing a semiconductor body having a surface;
    forming source and drain regions of a first conductivity type at the surface of the semiconductor body;
    performing an amorphizing implantation to form an amorphized region in a region of the semiconductor body where a pn-j unction is to be formed;
    performing a first implantation of dopants of the first conductivity type, in at least part of the amorphized region where the pn-junction is to be formed, to form source and drain extensions of the first conductivity type;
    performing a second implantation of dopants of a second conductivity type opposite the first conductively type, in part of the amorphized region where the pn-junction is to be formed, to form a channel region of the second conductivity type, the channel region extending between the source and drain extensions, thereby forming the pn junction;
    forming a gate dielectric on the surface of the semiconductor body above the channel region formed in the amorphized region; and
    forming a gate region on the gate dielectric.

13. The Method according to claim 12, further comprising forming a first mask on a first region of the semiconductor body where the channel region is to be formed prior to performing the first implantation; forming a second mask on the semiconductor body after performing the first implantation, edges of the first mask coinciding with edges of the second mask; and removing the first mask prior to performing the second implantation, the second implantation being carried out using the second mask, and the amorphizing, first and second implants are performed at an angle with the surface of the semiconductor body that is substantially equal to 90 degrees.

14. The Method according to claim 13, wherein the first mask and the second mask are formed in a self-aligned manner.

15. The Method according to claim 13, wherein the first mask is formed by a dummy gate region of a first dielectric material.

16. The Method according to claim 15, wherein the second mask is formed by depositing a masking layer of a second dielectric material, different from the first dielectric material, on the semiconductor body and subsequently removing, by chemical mechanical polishing, the second dielectric material from the top of the dummy gate region, the dummy gate region then being removed by selective etching prior to performing the second implantation.

17. The Method according to claim 16, wherein the gate region is formed by depositing a gate region layer on top of the semiconductor body after performing the second implantation and subsequently removing, by chemical mechanical polishing, the gate region layer from the top of the second mask, the second mask then being removed by selective etching.

18. The Method according to claim 12, further comprising annealing the first and second implantations at a temperature between 500 and 700 degrees Celsius.

19. The Method according to claim 12, wherein the source and drain regions are formed before the source and drain extensions.

20. The Method according to claim 1, wherein initial portions of the source and drain regions are formed by an initial implantation carried out prior to the amorphizing implantation, the amorphizing implantation is performed via an exposed upper surface of the semiconductor body of silicon, to form an amorphized region between the initial portions of the source and drain regions, the first implantation of dopants is performed to form the extensions of the source and drain regions in the amorphized region and the second implantation of dopants is performed to form a portion of the channel in the amorphized region, whereby the first and second implantations form a p-n junction in the amorphized region.

* * * * *